United States Patent
Budd et al.

(10) Patent No.: US 7,367,715 B1
(45) Date of Patent: May 6, 2008

(54) MEDIUM CONTAINING OPTICAL PATHS AND ELECTRICALLY CONDUCTING PATHS FOR APPLICATIONS IN HIGH SPEED DATA LINKS

(75) Inventors: Russell A. Budd, North Salem, NY (US); Punit P. Chiniwalla, Glenshaw, PA (US); Derek B. Dove, Venice, FL (US); James L. Sanford, Camas, WA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/689,788

(22) Filed: Mar. 22, 2007

(51) Int. Cl.
*G02B 6/36* (2006.01)
*G02B 6/44* (2006.01)
*G02B 6/10* (2006.01)

(52) U.S. Cl. .................... 385/88; 385/89; 385/90; 385/91; 385/92; 385/93; 385/94; 385/100; 385/101; 385/114; 385/129; 385/130; 385/131; 385/132

(58) Field of Classification Search ............ 385/88–94, 385/114, 100, 101, 129–132
See application file for complete search history.

(56) References Cited

U.S. PATENT DOCUMENTS

2005/0089264 A1\* 4/2005 Johnson et al. ............... 385/15

\* cited by examiner

*Primary Examiner*—Brian Healy
*Assistant Examiner*—Jerry Martin Blevins
(74) *Attorney, Agent, or Firm*—Scully, Scott, Murphy & Presser, P.C.; Daniel P. Morris, Esq.

(57) ABSTRACT

A structure that possesses the combined properties of carrying signals through the provision of a series of electrical conductors, and by optical signals through the intermediary of a series of optical waveguides. This imparts a particular advantage thereto for the fabrication of optical data links, providing a convenient, compact method of interconnecting electrical paths to transducer chips and to waveguide structures. This approach solves the problem of connecting polymer waveguides to VCSEL (Vertical-Cavity-Surface-Emitting Laser) arrays, thereby avoiding the problem of damaging fragile wire bonds. A method is also provided which utilizes the foregoing structure.

6 Claims, 1 Drawing Sheet

MEDIUM CONTAINING OPTICAL PATHS AND ELECTRICALLY CONDUCTING PATHS FOR APPLICATIONS IN HIGH SPEED DATA LINKS

BACKGROUND OF THE INVENTION

Field of the Invention

The present invention relates to the provision of a medium or structure, which contains optical paths and electrically conducting paths utilized for applications in high-speed data links.

In essence, the invention discloses a novel structure that possesses the combined properties of carrying signals through the provision of a series of electrical conductors, and by optical signals through the intermediary of a series of optical waveguides. This imparts a particular advantage thereto for the fabrication of optical data links, providing a convenient, compact method of interconnecting electrical paths to transducer chips and to waveguide structures. For example, this approach solves the problem of connecting polymer waveguides to VCSEL (Vertical-Cavity-Surface-Emitting Laser) arrays, thereby avoiding the problem of damaging fragile wire bonds.

SUMMARY OF THE INVENTION

Polymer waveguides are of particular interest as being capable of providing optical links for use in high-speed data systems. For example, a link may consist of a ribbon of polymer containing a number of closely spaced waveguides. The waveguides are connected to a VCSEL array, for instance, an array of surface emitting lasers such that light from each laser is directed into a corresponding guide. Typically, each laser in the array has its own electrical conductor supplying current, and it is necessary to configure these conducting paths in a manner, which enables both connection to an electrical substrate of some kind, for example, through the use of wirebonds or solder balls, and to the waveguide array. To that effect, the present invention discloses a novel way of integrating these electrical and optical connections in an advantageous and unique manner.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF THE INVENTION

Figure 1:
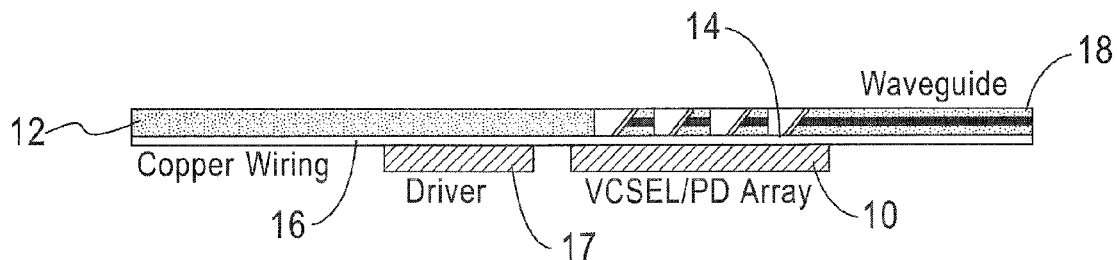
FIG. 1 illustrates, generally diagrammatically, an integration of a VCSEL/PD and a driver with a waveguide substrate.

As shown in FIG. 1, a VCSEL array chip 10 may be conveniently electrically bonded to a substrate 12 by a solder process; however, with the light-emitting surface 14 of the laser 10 and ad river 17 then being located adjacent to copper wiring 16 on the substrate. This makes it difficult to extract the light from the lasers, and the approaches to solve this problem are, typically, to drill holes through the substrate above each VCSEL, and to introduce microlenses or employ similar optical methods, in order to convey the laser light efficiently through the substrate to the desired waveguides 18.

Pursuant to another more restrictive method, the wavelength of the laser light and the laser structure are chosen so that the laser emission exits through the electrically common surface facing away from the substrate. The difficulties of these methods are avoided by patterning the surface of the waveguide carrying material, with an array of electrical conducting paths, to which the VCSEL may be connected, for example by solder ball or other known means. The waveguide material is very transparent to the laser radiation, and, in addition, is very thin, so that the laser light may be directed quite readily into mirrors in the waveguides immediately above the lasers.

The foregoing is a key advantage of this method. In addition other chips may be attached to the polymer guide material allowing flexibility in design, compactness, and providing a self contained data link. In effect, the electrical signals may be inputted into conducting paths on the polymer guide layer and outputted electrically at a further end. Special electrical and optical conducting paths of the data link carry out all the conversion from electrical to optical and from optical to electrical, and the transport of optical pulses by means of transducer chips. Hereby, it can be appreciated that thermal paths may also be incorporated in order to dissipate heat, which is generated by computer chips within the link. Link testing prior to installation is also facilitated, as well as field replacement of a defective link. The combination of optical light guiding structures, electrical conducting paths and electro-optical chips provides a great flexibility in an ability to be able to implement a number of useful high-speed data link structures.

Figure 2:
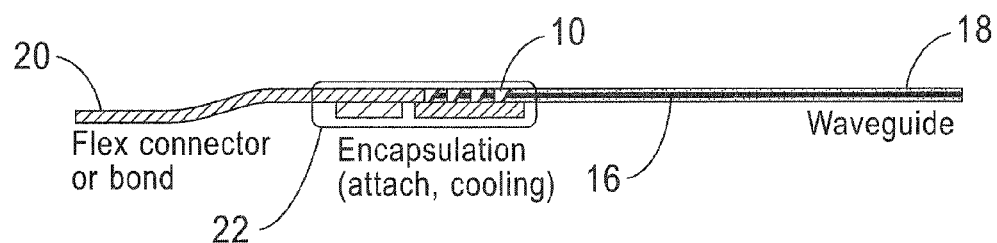
FIG. 2 illustrates a structure utilizing the invention as a flexible connector which is adapted to be plugged into a connector, or attached to a circuit board.

Reverting in particular to FIG. 2, this illustrates a flexible connector or a bond 20 showing a connection of a driver (not shown) and an encapsulated portion 22 for a VCSEL and/or photodiode (VCSEL/PD) array 10, as shown in FIG. 1 of the drawings, and which is connected to the waveguides 18.

Figure 3:
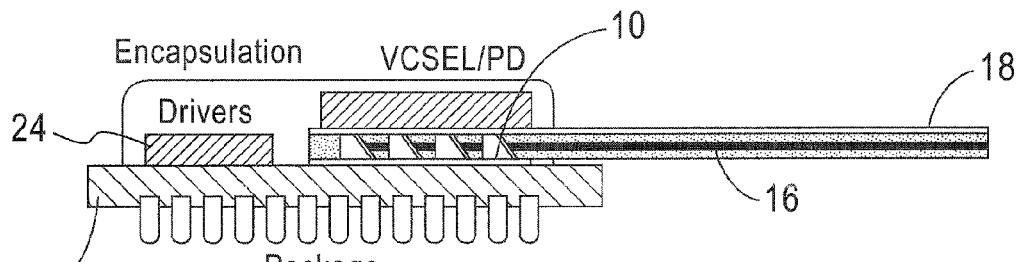
FIG. 3 illustrates the utilization of an optical flex to an electrical package connector.
Figure 4:
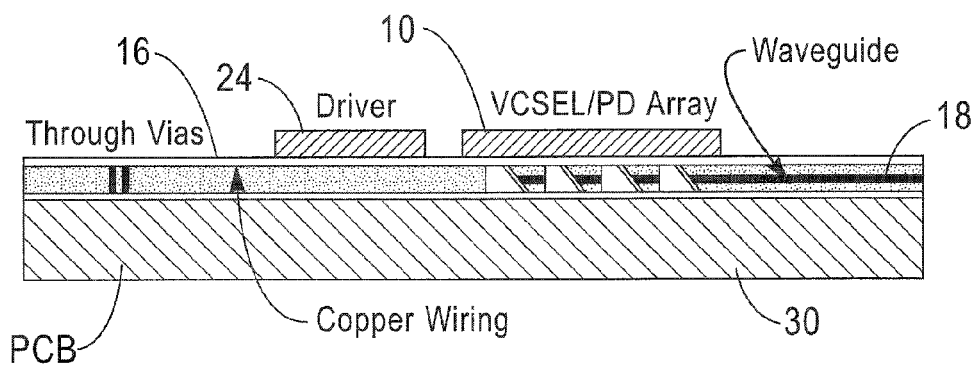
FIG. 4 illustrates the optical flex, as attached to a printed circuit board.

As illustrated in FIG. 3 of the drawings, this illustrates the encapsulation of the VCSEL/PD, similar to the structure of FIG. 2 and illustrating the drivers 24 mounted on an electronic package arrangement 26. Similarly, in FIG. 4, this shows the arrangement as in FIG. 3 with an optical flex being attached to a PCB 30.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A structure containing optical paths and electrically conducting paths for applications in high-speed data links; said structure comprising:
   at least one ribbon of a polymer material containing a plurality of waveguides;
   an array of surface-emitting lasers being connected to said waveguides such that light from each said laser is directed into a therewith associated waveguide;

each said laser being supplied with electrical current from an associated electrical conductor; each said electrical conductor provides an electrical path, which is configured to facilitate connections with an electrical substrate through wirebonds or solder balls and to the plurality of waveguides; and wherein said electrical paths in said polymer ribbon comprises transducer chips for converting the electrical paths into optical paths and said optical paths into electrical paths.

2. A structure as claimed in claim 1, wherein each said surface-emitting laser comprises a VCSEL and/or photodiode array.

3. A structure as claimed in claim 1, wherein said structure is mounted on a printed circuit wiring board (PCB).

4. A method of producing a structure containing optical paths and electrically conducting paths for applications in high-speed data links; said method comprising:

providing at least one ribbon of a polymer material containing a plurality of waveguides;

having an array of surface-emitting lasers connected to said waveguides such that light from each said laser is directed into a therewith associated waveguide;

supplying each said laser with electrical current from an associated electrical conductor each said electrical conductor providing an electrical path, which is configured to facilitate connections with an electrical substrate through wirebonds or solder balls and to the plurality of waveguides, and wherein said electrical paths in said polymer ribbon comprises transducer chips converting the electrical paths into optical paths and said optical paths into electrical paths.

5. A method as claimed in claim 4, wherein each said surface-emitting laser comprises a VCSEL and/or photodiode array.

6. A method as claimed in claim 4, wherein said structure is mounted on a printed circuit wiring board (PCB).

* * * * *